United States Patent [19]

Poetker et al.

[11] Patent Number: 4,539,472
[45] Date of Patent: Sep. 3, 1985

[54] DATA PROCESSING CARD SYSTEM AND METHOD OF FORMING SAME

[75] Inventors: John J. Poetker, Ellicott City; Peter Poetker, Columbia, both of Md.

[73] Assignee: Horizon Technology, Inc., Columbia, Md.

[21] Appl. No.: 567,743

[22] Filed: Jan. 6, 1984

[51] Int. Cl.³ .............................................. G06K 19/02
[52] U.S. Cl. ..................................... 235/488; 235/492
[58] Field of Search ................................. 235/492, 488

[56] References Cited

U.S. PATENT DOCUMENTS

| | | | |
|---|---|---|---|
| 3,637,994 | 1/1972 | Ellingboe | 235/488 |
| 4,001,550 | 1/1977 | Schatz | 235/492 X |
| 4,361,756 | 11/1982 | Parmentier | 235/492 X |
| 4,380,699 | 4/1983 | Monnier et al. | 235/492 |
| 4,417,413 | 11/1983 | Hoppe et al. | 235/488 X |
| 4,446,475 | 5/1984 | Gercekci et al. | 235/492 X |

Primary Examiner—David L. Trafton
Attorney, Agent, or Firm—Morton J. Rosenberg

[57] ABSTRACT

A data processing card system (10) which is mounted within the general geometrical contoured dimensions of a card-like housing (46). The data processing card system (10) includes a plurality of circuit chip devices (14) mounted to a flexible film carrier member (16). The flexible film carrier member (16) is electrically and mechanically coupled to a substrate carrier member (30). The substrate carrier member (30) includes an electrical pattern (40) at least formed on a first surface (34) thereof for electrical coupling to predetermined input leads of the circuit chip devices (14). The combination of the flexible film carrier member (16) and the substrate carrier member (30) are sandwiched between a pair of upper and lower plastic layers (42 and 44) in a substantially hermetic sealing type environment. An edge face (38) of the substrate carrier member (30) provides for a heat dissipation surface area as well as an area wherein electrical connecting pin members (36) are extended to the edge of face (38) for coupling with external devices. The data processing card system (10) is portable and may be carried by the user for insert into external terminal devices for actuation of the data processing card system (10).

60 Claims, 9 Drawing Figures

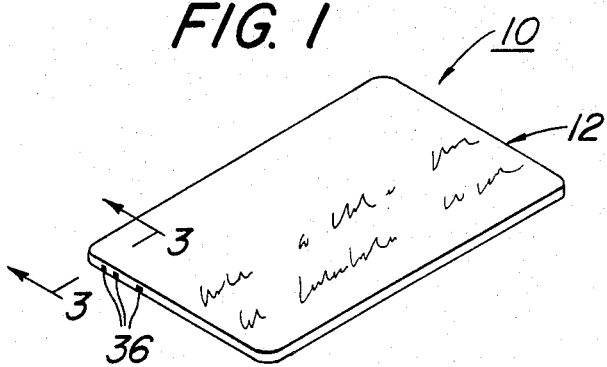
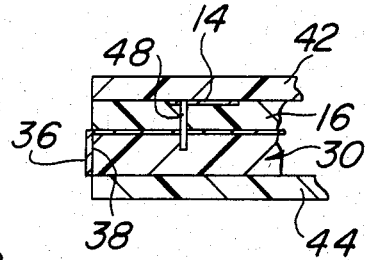
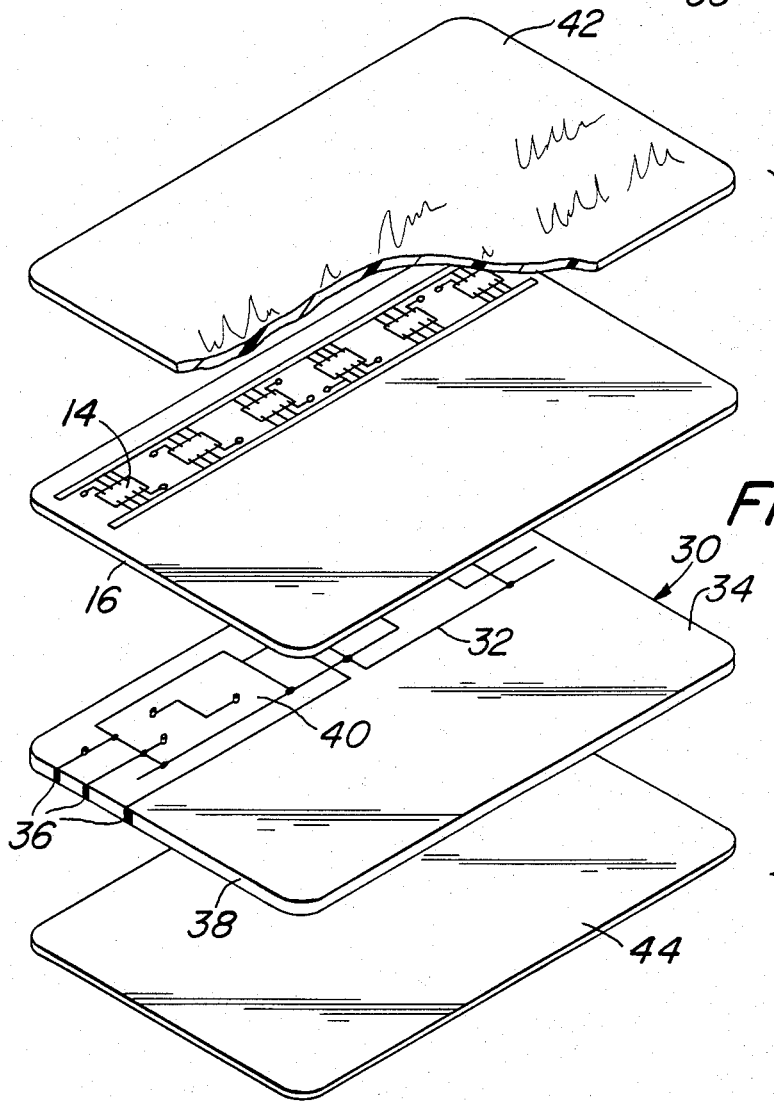

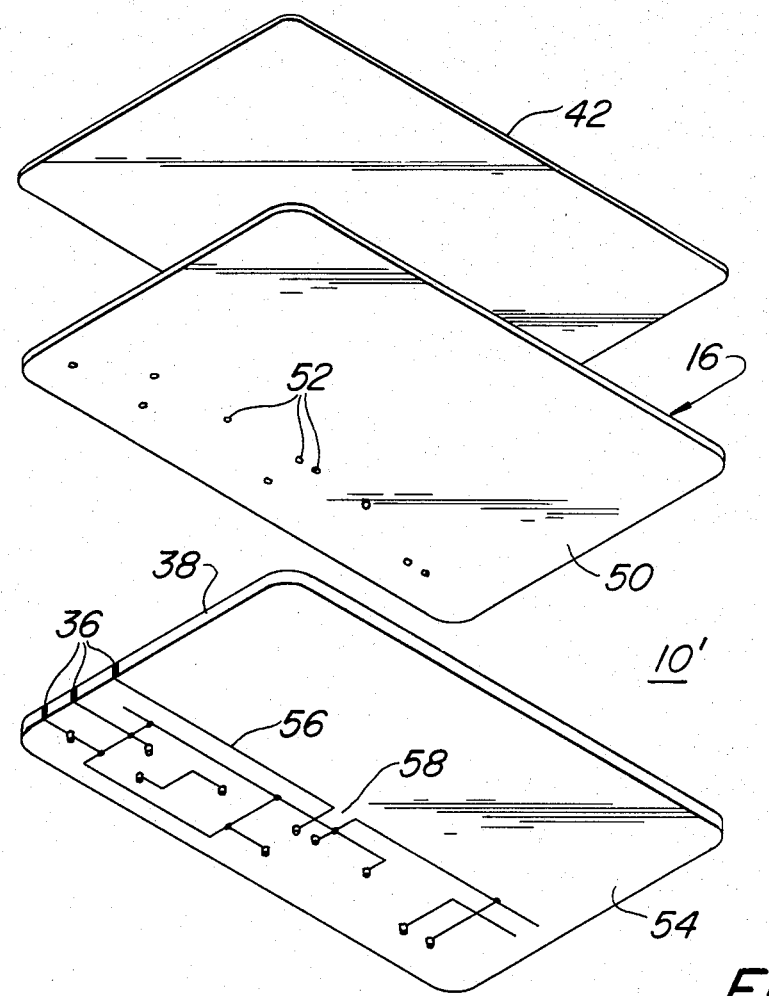
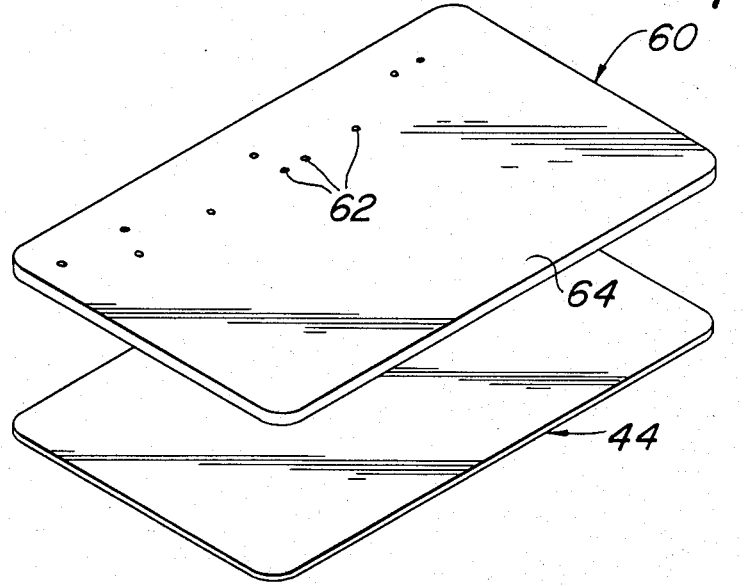
FIG. 4

DATA PROCESSING CARD SYSTEM AND METHOD OF FORMING SAME

BACKGROUND OF THE INVENTION

1. Field of the Invention

This invention pertains to data processing systems. In particular, this invention directs itself to a data processing system packaged within the confines of the geometrical dimensions of a card-like member. More in particular, this invention relates to a data processing system which includes a plurality of circuit chip devices mounted on at least one flexible carrier member. Still further, this invention pertains to a data processing system having a plurality of interconnected circuit chip devices which are electrically mounted to a flexible carrier member wherein the flexible carrier member is structurally and electrically coupled to a substrate carrier having at least one electrical pattern formed on at least one surface thereof. Still further, this invention relates to a data processing system wherein a plurality of inter-connected circuit chip devices are mounted on a flexible carrier interfaced therewith, and are electrically coupled to a rigid substrate carrier member having an electrical pattern formed thereon with predetermined electrical coupling between the circuit chip devices and the electrical pattern formed on the substrate carrier member. Additionally, this invention directs itself to a data processing system which includes a substrate carrier member coupled to a flexible carrier containing circuit chip devices which in combination are sandwiched between opposing substantially hermetically sealed layers. Further, this invention pertains to a data processing system which utilizes a rigid substrate carrier member for dissipation of heat and as an electrical interconnector between circuit chip devices mounted on the flexible film carrier member.

2. Prior Art

Data processing systems formed in the geometrical contour of a card-like member are known in the art. Prior art systems known to applicant include U.S. Pat. Nos.:

| | | |
|---|---|---|
| 4,295,041 | 4,211,919 | 4,352,011 |
| 4,222,516 | 4,004,133 | 3,702,464 |
| 4,064,522 | 3,876,865 | 4,105,156 |
| 4,102,493 | 3,906,460 | 4,092,524 |
| 4,001,550 | 4,007,355 | 4,256,955 |
| 4,204,113 | 3,845,277 | 3,971,916 |
| 3,637,994 | 3,559,175 | 4,361,756 |
| 4,298,793 | 3,641,499 | 3,142,823 |
| 3,970,824 | 3,438,489 | 3,831,119 |
| 3,851,153 | 3,881,175 | 4,115,662 |
| 4,058,830 | 3,934,122 | 3,868,057 |
| 3,873,019 | 3,852,571 | 3,378,920 |
| 3,894,756 | 3,134,254 | 3,185,964 |
| 3,377,616 | 3,772,659 | 3,832,530 |
| 3,849,633 | 4,022,370 | 3,919,447 |

In some prior art data processing systems, such as that shown in U.S. Pat. No. 4,295,041, there is provided a portable data carrier including a microprocessor. However, in such prior art systems, there are provided read only memory circuitry and such does not direct itself to electrically alterable program read only memory systems. Additionally, such prior art systems are not able to enclose standard type credit card housing sufficient circuitry to provide for an overall data processing system, as is provided by the subject invention concept.

In other prior art systems such as that shown in U.S. Pat. No. 4,211,919, there is provided a portable data carrier which also includes microprocessing systems. However, in such prior art systems, dense packaging of logic circuitry cannot be accomplished within the card-like housing geometrical constraints. Such prior art systems do not provide for a substrate carrier layer which is integrated into the electrical logic system, as is provided in the subject invention concept.

In other data processing systems, chip circuit devices are mounted and coupled to relatively thick carrier surfaces. Such carrier members do not allow for a plurality of circuit chips to be mounted in a manner to provide an overall relatively thin card-like data processing system.

In other prior art data processing card-like systems, a substrate carrier is provided which generally directs itself to dissipation of heat generated during operational use. However, such prior art systems do not provide for circuit patterns to be formed thereon and thus become a part of the logic circuitry of the overall data processing system.

Other prior art data processing systems are limited in the number of circuit chips mounted therein due to the fact that coupling of chip contact regions is limited by the physical dimensions of the system. Such prior art systems do not provide for a flexible carrier mounted below and in adjacent contiguous contact with circuit chips to maximize the number of electrical connections attainable as in the instant invention concept.

In still other prior art systems, the circuit chips forming the data processing system are mounted on relatively thick carriers which disadvantageously increases the overall thickness dimension of such prior art systems.

SUMMARY OF THE INVENTION

A data processing card system which includes a mechanism for mounting at least one circuit chip device thereon. A substrate carrier mechanism is located adjacent the circuit chip device mounting mechanism. The substrate carrier mechanism has at least a first predetermined electrical lead pattern formed thereon and the electrical pattern is electrically coupled to predetermined contact areas of the circuit chip device. There is also provided a mechanism for substantially isolating the combined substrate carrier mechanism and the circuit chip device mounting mechanism from an external environment.

BRIEF DESCRIPTION OF THE DRAWINGS

FIG. 1 is a perspective view of the data processing card system;

FIG. 2 is a perspective, exploded and partially cut-away view of the data processing card system showing the substrate carrier member and the flexible carrier member sandwiched between opposing isolating plastic layer members;

FIG. 3 is a sectional view of the data processing card system taken along the section line 3—3 of FIG. 1;

FIG. 4 is a perspective, and exploded view of an embodiment of the data processing card system showing a substrate carrier member sandwiched between first and second flexible carrier members each having a plurality of circuit chip devices mounted thereon for electrical interaction with lead patterns formed on opposing surfaces of the substrate carrier member;

DESCRIPTION OF THE PREFERRED EMBODIMENTS

Figure 5:
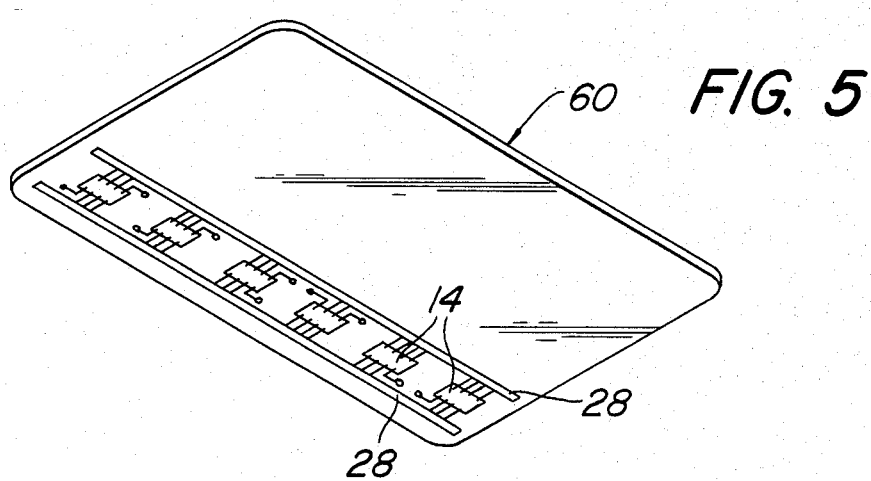
FIG. 5 is a perspective view of the second flexible carrier member showing the surface having circuit chip devices mounted thereon.

Referring now to FIGS. 1–3, there is shown data processing card system 10 which provides for an electronic logic circuit packaging technique to produce overall data processing card system 10 in an encapsulated manner within a substantially hermetically sealed housing 46 which takes on the overall geometrical contour of card member 12. Although not important to the inventive concept as will herein after be described, card member 12 may be rectangular in contour having a length and width substantially greater then the thickness. The thickness of card member 12 may generally be in the range of the thickness of a standard credit card commercially available in the market place.

As seen in FIG. 1, data processing card system 10 is encapsulated and packaged into thin housing 46 in the form of card member 12 or another type planar member. As will be seen in following paragraphs, data processing card system 10 as provided in the overall packaging technique and structure as herein described, is substantially hermetically sealed with respect to the external environment in order that data processing system 10 may be used in a wide variety of external environments, some of which may be deleterious to the logic circuitry contained therein. Thus, there is provided overall data processing system 10 which is made impervious to the external environment, is microminiaturized, is light weight and portable such that system 10 may be carried in one hand of a user.

In overall visual appearance, data processing system 10 as herein described, resembles well-known card type systems which include a magnetic media mounted or coated or otherwise applied to one surface of such magnetic media cards. However, data processing card system 10 as herein described is directed to a chip circuit device mounted within the confines of housing 46 into a geometrically contoured card member 12 in a manner which allows the user to essentially carry a substantially complete data system with the user during operational use.

Magnetic coatings on cards are of use, however, such do not provide for a substantially complete data processing system and such processing systems in the prior art would take a plurality or multiplicity of conventionally packaged integrated circuits placed on circuit boards which when soldered and interconnected, may provide for memory storage cell systems which have a large surface area and thickness and which are not amenable to the portability as provided by data processing system 10.

In overall concept, data processing system 10 provides for a plurality of logic chip circuits in a thin, miniaturized packaging scheme which provides for substantially hermetic sealing of the chip electronic circuitry in a dense packaging concept. Integrated circuit chips 14, shown in FIG. 2, are well known in the art and may be logic circuit chips, chip memory devices, and/or a combinations of thereof. Circuit chip devices 14 may be of the electrically erasable programmable read-only memory type such as that commercially produced by INTEL Corp. having a designation number 2816. This type of chip memory device 14 is operable from a 5.0 volt power supply in the read mode and the write/erase modes are accomplished by providing a voltage pulse approximating 21.0 volts. The electrical erase/write capability of the INTEL model number 2816 memory chip device 14 allows for a variety of applications requiring non-volatile erase and write modes.

In the embodiments shown in FIGS. 1–3, data processing system 10 includes a plurality of circuit chip devices 14 coupled to a mechanism for mounting chip devices 14 within data processing system 10. Circuit chip devices 14 are mounted onto first flexible film carrier 16 through use of one of a number of well known techniques. One technique of mounting chips 14 to first flexible film carrier 16 is clearly shown and described in U.S. Pat. No. 3,689,991 with an apparent improvement shown and described in U.S. Pat. No. 4,380,042. Chip devices 14 are lead bonded to first flexible film carrier 16 which includes a unique circuit design to allow circuit chips 14 to be interconnected into an overall data processing system 10.

Figure 6:
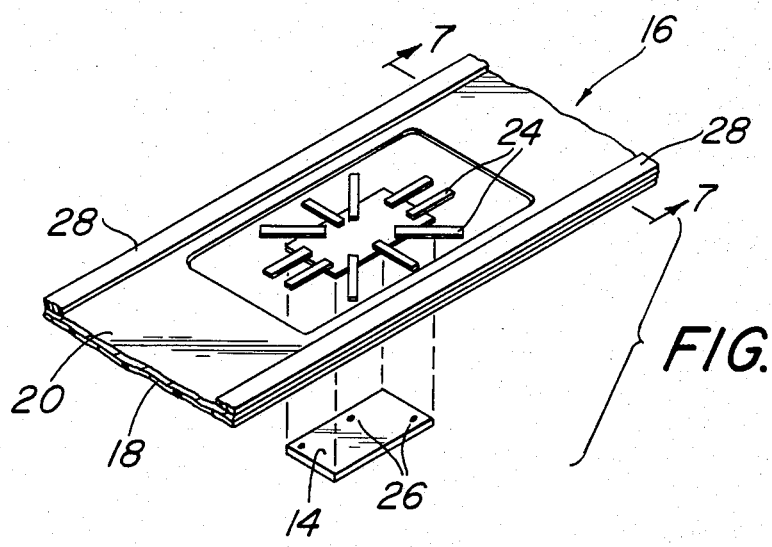
FIG. 6 is a perspective and exploded view of a portion of the first or second carrier members and the positional alignment of the circuit chip thereon.
Figure 7:
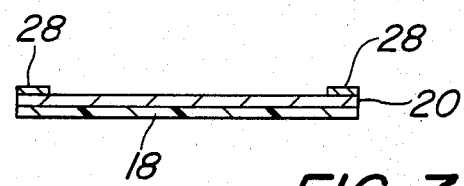
FIG. 7 is a sectional view of the first or second flexible film carrier members taken along the section lines 7—7 of FIG. 6.

Referring now to FIGS. 6 and 7, there is shown the mounting mechanism and structure for circuit chips 14. As can be seen in FIG. 6, in partial cutaway and perspective view, first flexible film carrier 16 is shown with one chip device 14 removed therefrom for clarity purposes. As shown in FIG. 6, chip device 14 is alignable with a lower portion of first flexible film carrier 16, however, chip device 14 may be mounted on a top surface as is well known in the art.

Flexible film carrier 16 includes electrically insulating tape 18 which is electrically insulated and a thin foil strip or layer member 20 which is electrically conducting and secured to insulating layer 18 by adhesive lamination or some like technique, not important to the overall concept.

FIGS. 6 and 7, are exaggerated in thickness for clarity of visual observation, however, the overall thickness of insulating and conductive layers 18 and 20 in combination may be within the approximating dimensional thickness range of 0.005 to 0.01 inches with an overall preferred dimensional thickness of first flexible film carrier member 16 approximating 0.0075 inches. Electrically conducting layer 20 may be a thickness in the approximating range of 0.0001 to 0.0005 inches. Additionally, in order to provide a quantitative dimension to overall first flexible film carrier 16, chip circuit devices 14 of the type herein described may include a dimensional thickness within the approximating range of 0.01 to 0.04 inches with a preferred dimensional thickness approximating 0.02 inches. First flexible film carrier member 16 is of the type shown and described in U.S. Pat. Nos. 3,689,991 and 4,380,042.

Apertures 22 extend through first flexible film carrier 16 and are aligned with logic chip device 14 for insert therein. As shown in FIG. 6, portions of electrically conducting layer 20 may be removed from overall flexible film carrier 16 to form a plurality of metallic or conducting leads 24 for contacting predetermined active regions 26 of circuit chip device 14. Removal of electrically conducting layer member 20 in a predetermined pattern may be accomplished by photolithographic masking and etching, or other well known techniques in the art. Subsequent to removal of predetermined portions of electrically conductive foil layer 20, lead members 24 are formed and extend internal to aperture 22 to provide for contact bonding of chip devices 14 to electrical lead members 24.

In the manufacturing process for first flexible film carrier member 16 having a plurality of chip devices 14 adhered thereto, a strip of insulating tape layer 18 in combination with electrically conducting layer 20 is initially provided. Central aperture 22 passing through layers 18 and 20 locate the inner portion of metallic lead members 24 which are formed by etching away predetermined portions of electrically layer 20 external to the predetermined geometrical configuration of leads 24.

The inner end portions of metallic leads 24 extend in a generally radial outward direction from the central portion of aperture 22 as shown in FIG. 6. The inner end portions of leads 24 terminate internal to aperture 22 and terminate in registry or alignment with a contact regions 26 of chip devices 14. Logic chip devices 14 may then be placed in alignment with aperture 22 and the inner ends of leads 24 are secured to chip devices 14 at contact regions 26.

Prior to logic or memory chip devices 14 being coupled to leads 22, first flexible film carrier member 16 may be unwound from a reel, as is known in the art, and leads 24 formed thereon through appropriate pattern etching techniques. First flexible film carrier 16 may then be immersed in a tin plating solution to plate the exposed portions of lead 24 with a solderable metal. Thus, both sides of the exposed portions of leads 24 within aperture 22 are tin coated.

Semi-conductor devices 14 may then be bonded to leads 24 by application of an electrical conductor wherein logic and/or memory devices 14 may include metallic contacts attached to electrically active regions 26. To effect the bonding of the contacts to leads 24, the tin plated leads 24 are pressed against the contacts by a displacement of a heatable bonding tip system which is well known in the art. Bonding may then be achieved by applying electrical resistance heating current to the tip and such is raised to a sufficiently high temperature to cause the tin plated leads 24 to be bonded to the gold contacts of the contact regions 26.

Thus, in a final structure, the first flexible film carrier member 16 includes electrically insulating tape layer member 18 having a plurality of apertures 22 formed therethrough for registry with predetermined electrically active areas 26 of a plurality of circuit chip devices 14. Film carrier 16 further includes a plurality of electrically conductive lead members 24 which are coupled to insulating tape member layer 18 and extend within apertures 22 for coupling to electrically active areas 26 of circuit chip devices 14.

In conventional tab bonding processes and techniques, as is described in U.S. Pat. Nos. 3,689,991 and 4,380,042, there is no provision made for mounting of a plurality of chip devices 14 into an overall system as is herein described. Thus, such conventional bonding processes mount one logic chip 14 within a frame without a provision for multiple frames and do not permit the description of an operating circuit design, as is herein described.

Additionally, in order to couple a plurality of chip devices 14 in consecutive manner on first flexible film carrier 16, there is provided metallic buss bar foil member 28, as is shown in FIGS. 1 and 6, to which chip devices 14 are electrically coupled. In this manner, a plurality of chip devices 14 may be coupled each to the other, dependent upon a particular circuit design requirement, not part of the subject invention concept.

Data processing card system 10 as herein described replaces a standard printed circuitboard using generally photo-etched copper circuit patterns with flexible film carriers which interconnect logic and/or memory chips 14 into a singular operating data processing card system 10. A plurality of chip devices 14 mounted on consecutive frames of first film carrier 16 provide for a total system pattern which is repeated on first film carrier member 16 in a manner such that overall data processing system 10 may be easily bonded as well as tested.

Referring now to the embodiment of data processing card system 10, as shown in FIGS. 1-3, it is seen that first flexible film carrier member 16 is mounted to substrate carrier member 30. In some prior art systems, various substrate carriers have been used for heat dissipation purposes. As will be seen in following paragraphs, substrate carrier member 30 of the subject invention concept is formed and used for a plurality of objectives and purposes which are important to the overall concept of card system 10.

In particular, substrate carrier member 30 of data processing system 10 is formed as part of the overall logic circuitry to carry parallel bussing for each chip device 14. Additionally, substrate carrier member 30 may be used to interconnect chip circuits dependent upon the particular logic involved. Further, substrate carrier member 30 is generally formed of a substantially rigid type composition to provide a mechanical support for first flexible film carrier 16 and associated circuit chips 14 and finally is used as a heat dissipation device for data processing system 10 during the operational mode. Thus, substrate carrier member 30 in addition to heat dissipation uses, provides for an electrical interconnection system to couple circuit chip 14 into an overall operating data processing system 10 and is interrelated and a part of the electrical design concept.

In order to provide for an electrically insulative material composition in combination with a thermally conductive composition, substrate carrier member 30 may be formed of ceramic, Kovar, or some like material which will aid in the heat dissipation of system 10 during operation while simultaneously maintaining a substantially electrically insulative barrier. Additionally, such materials also give some rigidity to system 10 which is important since it is understood that film carrier 16 is extremely flexible in structural rigidity and overall card system 10 must be of sufficient rigidity to allow operational use in a number of user environments.

As can be clearly seen in FIG. 2, substrate carrier leads 32 are formed into an overall first predetermined electrical lead pattern 40 formed on upper or top surface 34 of substrate carrier member 30. First substrate electrical pattern 40 may be formed through photoresist etching or some like technique not important to the inventive concept as herein described. The overall pattern of electrical substrate carrier leads 32 match the circuit pattern required to interconnect the address data busses of circuit chip devices 14 into an overall operating system. Thus, through the use of first predetermined electrical pattern 40, all that may be mounted or carried on first flexible film carrier 16 are the lines or leads which are unique to a particular circuit chip device 14 such as chip enable lines, read/write lines, or other unique device lines.

Thus, substrate carrier member 30 is mounted adjacent to the circuit chip device mounting member or first flexible film carrier member 16 with substrate carrier member 30 having at least first predetermined electrical lead pattern 40 formed thereon. For operational use, first electrical lead pattern 40 is electrically coupled to predetermined contact areas 26 of chip devices 14 as is evident to provide an operating electrical system.

As can be seen in FIGS. 2 and 3, a plurality of substrate carrier leads 32 of first substrate electrical pattern 40 may expand to substrate carrier edge face 38 where such terminate in electrically connective pin members 36. Electrically connective pin members 36 mounted on edge face 38 provide for the electrical coupling of data processing system 10 to an external terminal device not part of the subject invention concept. Electrically connective pin members 36 provide for interconnection from data processing system 10 to input/output devices which are well known in the art. Thus, through use of such electrically connective pin members 36, subsequent to encapsulation, data processing system 10 may be seen to be electrically coupled to an external electrical device for actuation thereof responsive to particular logic circuits contained therein.

As seen in FIG. 3, chip pin members 48 are used to couple predetermined substrate carrier leads 32 within the overall first predetermined electrical lead pattern 40 as well as to individual circuit chips 14. Chip pin member 48 may be electrically coupled to predetermined electrical lead members 24 on one end thereof and extend into electrical contact with predetermined substrate carrier leads 32 as is necessitated by the particular design logic. It is to be understood that chip pin members 48 may be discrete chip pin members or may simply be extensions of foil electrical lead members 24 which are directed in a downward manner through first flexible film carrier 16 into contact with predetermined substrate carrier leads 32. The manner and mode of particularly coupling circuit chips 14 to first predetermined electrical lead patern 40 may be through a number of techniques with the use of chip pin members 48 being shown and described for illustrative purposes.

Still referring to the embodiment of data processing card system 10 as shown in FIGS. 1–3, there is further provided a mechanism for substantially isolating substrate carrier member 30 and first flexible film carrier 16 from an external environment. Referring to FIGS. 2 and 3, the isolating mechanism includes a pair of substantially planar layer members 42 and 44 which are coupled to combined substrate carrier member 30 and first flexible film carrier 16 on opposing sides thereof. Planar layer members 42 and 44 are generally formed of a plastic composition material. Plastic layer members 42 and 44 are applied above and beneath the combination of flexible film carrier 16 and substrate carrier 30 and are generally bonded thereto by appropriate heat and pressure techniques well known in the art.

As has been stated, substrate carrier member 30 may be formed of a ceramic, glass, silicon oxide composition, or Kovar which is generally a steel carrier having a porcelain coating. Dependent upon the other material composition of card system 10, substrate carrier member 30 is generally designed to be formed of a material which is substantially matched to the temperature coefficient of expansion/contraction of chip devices 14 which may be generally silicon based.

First substrate electrical pattern 40 formed by electrically connecting or lead members 32 interconnect the plurality of attached flexible film carrier member systems in order that a plurality of circuit chip devices 14 may be system integrated. Each of the carriers may then be interconnected together in a unique format dependent upon the logic systems involved to provide an overall electronic system. Thus, as has been stated, an important purpose and objective of substrate carrier member 30 is to provide a basis for interconnecting the plurality of system level carriers and circuits into an overall operating circuit. Additionally, substrate carrier member 30 mechanically supports the circuits and further dissipates the heat generated by each of chip devices 14 when in an operational mode.

In overall operation in manufacturing data processing card sysem 10, a plurality of chip circuit devices 14 may be mounted to first flexible film carrier 16 in a manner clearly shown and described in U.S. Pat. Nos. 3,689,991 and/or 4,380,042. Electrical pattern 40 may be formed through photo-resistive etching on substrate carrier member 30 in a manner well known in the art. First flexible film carrier 16 may then be bonded to substrate carrier member 30 in a registered manner by adhesive bonding. It is to be understood that the adhesive used in such a bonding process has a temperature coefficient of expansion/contraction which substantially matches the composition material of circuit chip devices 14 as well as the particular material compostion of substrate carrier member 30. In this manner, first flexible film carrier 16 is adhesively mounted in secured manner to substrate carrer member 30 which in itself is generally and substantially non-electrically conductive, however, is substantially thermally conductive for the dissipation of heat generated by circuit chips 14 during their operational mode. Heat and pressure are applied to weld the appropriate patterns carried on flexible film carrier 16 to attachment points on the matrix or first substrate electrical pattern 40 formed on substrate member 30. Finally, plastic layers 42 and 44 are applied above and beneath the combination of first flexible film carrier 16 and substrate carrier member 30 and such layers 42 and 44 are bonded thereto by appropriate heat and pressure techniques well known in the art.

Of importance to the inventive concept of data processing card system 10 is the provision of substrate carrier member 30 to provide a system interconnect and thus become a building block of designing electronic systems in a chip type format as herein described. The photo-resistive etched first substrate electrical pattern 40 is a circuit matrix and provides for an integral part of the overall electrical system in contradistinction to merely providing a lead out connection.

Referring now to FIGS. 4 and 5, there is shown data processing card system 10' which is an embodiment of data processing card system 10 previously described in FIGS. 1–3. For clarity, elements of card system 10' which are substantially the same as elements provided for card system 10, are given like numbers. The concept of data processing card system 10' is to provide a layered system which is utilized for providing additional circuit chip devices 14 with increased logic circuitry while simultaneously maintaining a relatively thin overall housing structure.

As was the case in data processing card system 10, embodiment data processing card system 10' includes first flexible film carrier member 16 which interfaces and is contiguously located with respect to substrate carrier top surface 34. As seen in FIG. 4, first flexible film carrier 16 includes first flexible film carrier lower surface 50 through which there is shown connective openings 52 for coupling of circuit chip devices 14 to first substrate electrical pattern 40 (shown in FIG. 2). It is to be understood that substrate carrier top surface 34 shown in FIG. 4 contaives first substrate electrical pattern 40 which has been described in connection with data processing card system 10 as shown in FIGS. 1–3.

As shown in FIG. 4, substrate carrier member 30 includes substrate carrier member lower surface 54 which has formed thereon lower surface electrical leads 56 formed into second substrate electrical pattern 58 in a manner similar to that provided for data processing card system 10 as previously described. Lower surface leads 56 of second substrate electrical pattern 58 extend to substrate carrier edge face 38 and terminate in electrically connective pin member 36 for electrical coupling to external devices.

Second flexible film carrier 60 carrying and having mounted thereon a plurality of circuit chip devices 14 as shown in FIG. 5 is mated to substrate carrier lower surface 54. Second flexible film carrier 60 includes connective openings 62 for interfacing and connecting circuit chips 14 to second substrate electrical pattern 58. Upper surface 64 of second flexible film carrier member 60 is matingly engaged with substrate carrier lower surface 54 in the substantially identical manner that first flexible film carrier lower surface 50 is matingly engaged with substrate carrier top surface 34. It is to be understood that electrical coupling of circuit devices 14 on first film carrier member 16 may be electrically coupled to circuit devices 14 on second flexible film carrier 60 through interconnection openings or other connectable means passing through substrate carrier member 30.

Thus, first and second electrical patterns 40 and 58 may be formed on opposing surfaces 34 and 54 of substrate carrier member 30 to provide a dual sided interconnect system. In this manner, a plurality of flexible film carrier members such as 16 and 60 may be seen to be mounted on opposing surfaces of substrate carrier member 30 to provide increased design logic considerations for data processing card system 10'. As was the case in data processing card system 10, plastic type composition layers 42 and 44 may be mounted and bonded to the combined layer members 16, 30 and 60 to provide a substantially hermetic seal for card system 10'. Upper and lower layer members 42 and 44 are preferably formed of a plastic composition material which may be thin sheets of polyvinyl chloride generally approximate a thickness of 0.005 inches or less and are bonded to the combined flexible carrier members 16 and 60 by adhesive, heat bonding, or like manner.

Figure 8:
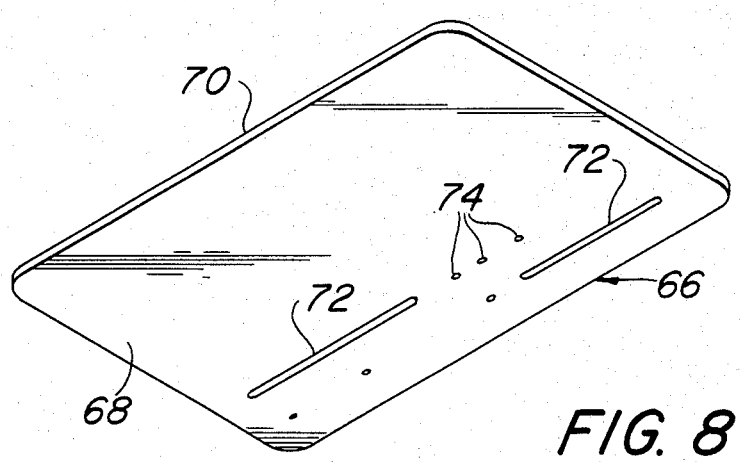
FIG. 8 is a perspective view of a chip coupling flexible carrier member.

Referring now to FIG. 8, there is shown a mechanism for electrically coupling at least a pair of circuit chip devices 14 each to the other between a predetermined contact area 26. As will be seen in following paragraphs, the chip electrical coupling mechanism is sandwiched between substrate carrier member 30 and first and second flexible carrier members 16 and 60. The electrical coupling mechanism shown in FIG. 8 may be utilized where the diminished area and distances of between circuit chips 14 do not permit all of the necessary electrical contacts being completed.

In the case where additional contact and electrical leads are necessitated, there is a provided chip coupling flexible carrier member 66 for electrically coupling predetermined contact regions 26 of separate circuit chips 14 each to the other. As was the case with first and second flexible carrier members 16 and 60, chip coupling flexible carrier member 66 includes an electrically insulating tape member having opposed first and second surfaces 68 and 70. Chip coupling carrier member 66 further includes a plurality of electrically conductive chip coupling lead members 72 which are secured to first surface 68 of the electrically insulating tape member. Chip coupling lead members 72 may be generally of the same foil layer construction as that provided and described for electrically conductive foil layer 20 and leads 24 of first carrier member 16.

First surface 68 of chip coupling flexible carrier member 66 is mounted adjacent to surface 50 of first flexible carrier member 16 and/or adjacent surface 64 of second carrier member 60. Pin members passing through opening 62 and/or 52 of associated carriers 60 and 16 contact chip coupling lead members 72 and such pin members may be connected to a predetermined electrical leads 24 to provide electrical coupling between individual circuit chips 14. Thus, in the embodiment shown in FIGS. 1–3, chip coupling flexible carrier member 66 would be sandwiched between first flexible film carrier member 16 and substrate carrier member 30. In the embodiments shown in FIGS. 4 and 5, data processing card system 10' would include a pair of chip coupling flexible carrier members 66 sandwiched between first flexible carrier member 16 and substrate planar member 30 as well as second flexible carrier member 60 and substrate planar member 30 respectively. In order to provide coupling between chip devices 14 on carrier members 16 and 60 and associated portions of first and second substrate electrical patterns 40 and 58, chip coupling openings 74 may be provided to allow other lead pin members to extend therethrough.

Figure 9:
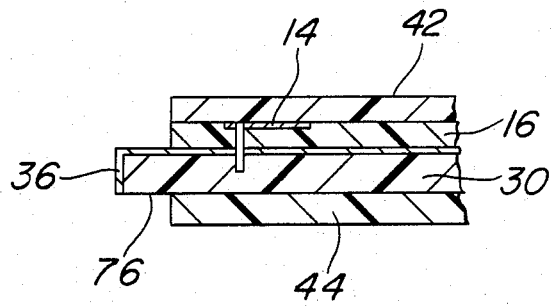
FIG. 9 is a sectional view of an embodiment of the data processing card system showing an extended substrate carrier member.

Referring now to FIG. 9, there is shown an embodiment of data processing card system 10 as provided in FIGS. 1–3. It is to be understood that the embodiment shown in FIG. 9 is equally applicable to data processing card system 10' as it is to card system 10. In the cross section shown in FIG. 9, substrate carrier member 30 is seen to be extended beyond the peripheral boundaries of upper and lower plastic layers of 42 and 44 as well as beyond first flexible film carrier member 16. As can be understood, substrate carrier member 30 provides for additional surface area 76 to aid in any additional heat dissipation which may be necessitated. As was the calculation of substrate carrier surface edge thickness 38, additional surface areas 76 may be calculated based upon the heat dissapation requirements necessitated by the particular heat generating logic circuitry contained within card system 10 or card system 10'.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A data processing card system, comprising:
  (a) means for mounting at least one circuit chip device, said circuit chip mounting means including first flexible carrier means comprising an electrically insulating tape layer member having at least one aperture formed therethrough for registry with predetermined electrically active areas of said chip device and a plurality of electrically conductive lead members secured to said insulating tape member and extending within said aperture for coupling to said active areas of said chip device;
  (b) substrate carrier means formed of a substantially rigid, electrically insulated and thermally conductive member composition located adjacent said circuit chip device mounting means, said substrate carrier means having at least a first predetermined electrical lead pattern formed thereon, said first electrical lead pattern being electrically coupled to predetermined contact areas of said circuit chip device; and,
  (c) means for substantially isolating said combined substrate carrier means and said circuit chip device mounting means from an external environment.

2. The data processing card system as recited in claim 1 including a plurality of circuit chip devices coupled to said circuit chip device mounting means.

3. The data processing card system as recited in claim 2 where a predetermined set of circuit chip devices are electrically coupled to said first electrical lead pattern formed on said substrate carrier means.

4. The data processing card system as recited in claim 2 where at least one of said circuit chip devices is a chip memory device.

5. The data processing card system as recited in claim 4 where at least one of said chip memory devices is an electrically erasable programmable read only memory device.

6. The data processing card system as recited in claim 1 where at least one of said electrically conductive lead members is coupled to said circuit chip device on an upper surface and is coupled to said first electrical lead pattern on a lower surface.

7. The data processing card system as recited in claim 1 where said electrically conductive lead members are formed of an electrically conductive foil layer.

8. The data processing card system as recited in claim 1 where said circuit chip memory is an electrically erasable programmable read only memory device.

9. The data processing card system as recited in claim 1 where said circuit chip device mounting means includes a dimensional thickness within the approximating range of 0.005 to 0.01 inches.

10. The data processing card system as recited in claim 1 where said circuit chip device includes a dimensional thickness within the approximating range of 0.01 to 0.04 inches.

11. The data processing card system as recited in claim 1 where said substrate carrier means is formed of a substantially electrically insulative material composition.

12. The data processing card system as recited in claim 11 where said substrate carrier means is formed of a substantially thermally conductive material composition.

13. The data processing card system as recited in claim 13 where said substrate carrier means includes a substantially planar substrate member having an upper surface and a lower surface.

14. The data processing card system as recited in claim 13 where said substantially planar substrate member upper surface has said first predetermined electrical lead pattern formed thereon.

15. The data processing card system as recited in claim 14 where said first predetermined electrical lead pattern is photo-etched into said upper surface of said substantially planar substrate member.

16. The data processing card system as recited in claim 14 including means for electrically coupling at least a pair of circuit chip devices each to the other between predetermined contact areas, said chip electrical coupling means being sandwiched between said substrate carrier means and said circuit chip mounting means.

17. The data processing card system as recited in claim 16 where said chip electrical coupling means includes first chip coupling flexible carrier means for electrically coupling said predetermined chip contact areas each to the other.

18. The data processing card system as recited in claim 17 where said first chip coupling flexible carrier means includes:
  (a) an electrically insulating tape member having opposed first and second surfaces; and,
  (b) a plurality of electrically conductive chip coupling lead members secured to said first surface of said electrically insulating tape member, said second surface of said electrically insulating tape member being positionally located adjacent said upper surface of said substantially planar substrate member.

19. The data processing card system as recited in claim 18 where said electrically conductive chip coupling lead members are formed of an electrically conductive foil layer.

20. The data processing card system as recited in claim 15 where said first predetermined electrical lead pattern includes at least one electrical coupling line extending to a peripheral boundary of said substantially planar substrate member for electrically connecting said data processing system to an external electrical device.

21. The data processing card system as recited in claim 14 including at least a second predetermined electrical lead pattern formed on said lower surface of said substantially planar substrate member.

22. The data processing card system as recited in claim 21 where said means for mounting said circuit chip device includes second flexible carrier means having at least a second circuit chip device mounted thereto, said second circuit chip device being electrically coupled to said second predetermined lead pattern.

23. The data processing card system as recited in claim 22 including means for electrically coupling at least a pair of second circuit chip devices each to the other between predetermined contact areas, said means for electrically coupling said second circuit chip devices being sandwiched between said substrate carrier means and said second flexible carrier means.

24. The data processing card system as recited in claim 23 where said second chip coupling means includes second chip coupling flexible carrier means for electrically coupling said predetermined contact areas each to the other.

25. The data processing card system as recited in claim 24 where said second chip coupling flexible carrier means includes:
    (a) an electrically insulating tape member having opposed first and second surfaces; and,
    (b) a plurality of electrically conductive chip coupling lead members secured to said first surface of said electrically insulating tape member, said second surface of said insulating tape member being positionally located adjacent said lower surface of said substantially planar substrate member.

26. The data processing card system as recited in claim 25 where said electrically conductive chip coupling lead members are formed of an electrically conductive foil layer.

27. The data processing card system as recited in claim 22 including means for electrically coupling said first and second electrical lead patterns each to the other in a predetermined manner.

28. The data processing card system as recited in claim 13 where said substantially planar substrate member includes an edge boundary surface area substantially exposed to said external environment for dissipation of heat therefrom.

29. The data processing card system as recited in claim 13 where said substantially planar substrate member includes a thickness within the approximating range of 0.0001 to 0.001 inches.

30. The data processing card system as recited in claim 1 where said isolation means includes a pair of substantially planar layer members coupled to said combined substrate carrier means and said memory chip device mounting means on opposing sides thereof.

31. The data processing card system as recited in claim 30 where said substantially planar layer members are formed of a plastic composition material.

32. A method of forming a data processing card system including the steps of:
    (a) securing at least one circuit chip device to at least a first flexible carrier member;
    (b) forming a first predetermined electrical lead pattern on an upper surface of a substantially rigid, electrically insulative, and thermally conductive substrate carrier member; and,
    (c) electrically coupling said circuit chip device to said first electrical lead pattern formed on said substrate carrier member.

33. The method of forming a data processing card system as recited in claim 32 where the step of securing said circuit chip device is preceded by the step of providing said first flexible carrier member having an electrically insulating tape layer member and an electrically conductive layer member secured each to the other.

34. The method of forming a data processing card system as recited in claim 33 where the step of providing said first flexible carrier member includes the step of removing predetermined portions of said electrically conductive layer member to form a plurality of electrically conductive lead members.

35. The method of forming a data processing card system as recited in claim 34 where the step of securing said circuit chip device includes the step of aligning said circuit chip device with at least one aperture formed through said first flexible carrier member.

36. The method of forming a data processing card system as recited in claim 35 where the step of aligning said circuit chip device is followed by the step of bonding said circuit chip device to at least one electrically conductive lead member extending internal the perimetrical boundary of said aperture.

37. The method of forming a data processing card system as recited in claim 36 where the step of bonding includes the step of electrically soldering said electrically conductive lead member to a predetermined electrically active area of said circuit chip device.

38. The method of forming a data processing card system as recited in claim 32 where the step of securing includes the step of coupling a plurality of circuit chip devices to said first flexible carrier member.

39. The method of forming a data processing card system as recited in claim 38 where at least one of said circuit chip devices is a chip memory device.

40. The method of forming a data processing card system as recited in claim 39 where said chip memory device is an electrically erasable program read only memory device.

41. The method of forming a data processing card system as recited in claim 32 where the step of forming said first predetermined electrical lead pattern on said upper surface includes the step of etching said first predetermined electrical lead pattern into said upper surface of said substrate carrier member.

42. The method of forming a data processing card system as recited in claim 41 where the step of etching includes the step of photo etching said first predetermined electrical lead pattern onto said upper surface of said substrate carrier member.

43. The method of forming a data processing card system as recited in claim 32 where the step of forming said first predetermined electrical lead pattern is followed by the step of forming a second predetermined electrical lead pattern on a lower surface of said substrate carrier member.

44. The method of forming a data processing card system as recited in claim 43 where the step of forming said second predetermined electrical lead pattern includes the step of extending at least one lead line from said lead pattern to a peripheral boundary of said substrate carrier member for electrical coupling to an external electrical device.

45. The method of forming a data processing card system as recited in claim 43 where the step of forming said second predetermined electrical lead pattern includes the step of etching said second predetermined electrical lead pattern into said lower surface of said substrate carrier member.

46. The method of forming a data processing card system as recited in claim 32 including the step of providing at least a first chip coupling flexible carrier member having a plurality of electrically conductive chip coupling lead members formed on a first surface thereof for electrically coupling a plurality of circuit chip devices each to the other.

47. The method of forming a data processing card system as recited in claim 46 where the step of providing said first chip coupling flexible carrier member is followed by the step of sandwiching said first chip coupling flexible carrier member between said first flexible carrier member and said substrate carrier member.

48. The method of forming a data processing card system as recited in claim 32 including the step of securing a plurality of circuit chip devices to at least a second flexible carrier member.

49. The method of forming a data processing card system as recited in claim 48 including the step of providing at least a second chip coupling flexible carrier member having a plurality of electrically conductive chip coupling lead members formed on a first surface thereof for electrically coupling at least a pair of circuit chip devices each to the other.

50. The method of forming a data processing card system as recited in claim 49 where the step of providing said second chip coupling flexible carrier member is followed by the step of sandwiching said second chip coupling flexible carrier member between said second flexible carrier member and a lower surface of said substrate carrier member having a second predetermined lead pattern formed thereon.

51. The method of forming a data processing card system as recited in claim 32 including the step of substantially encapsulating said combined first flexible carrier member and said substrate carrier member.

52. The method of forming a data processing card system as recited in claim 51 where the step of substantially encapsulating includes the step of providing a pair of encapsulating layer members, said combined first flexible carrier member and said substrate carrier member being sandwiched therebetween.

53. The method of forming a data processing card system as recited in claim 52 where the step of providing said pair of encapsulating members includes the step of bonding said encapsulating members to said combined first flexible carrier member and said substrate carrier member.

54. The method of forming a data processing card system as recited in claim 53 where the step of bonding includes the step of heat bonding said pair of encapsulating members to said combined first flexible carrier member and said substrate carrier member.

55. The method of forming a data processing card system as recited in claim 54 where said encapsulating members are substantially planar in contour.

56. The method of forming a data processing card system as recited in claim 55 where said pair of substantially planar encapsulating members are formed of a plastic composition.

57. The method of forming a data processing card system as recited in claim 32 where said flexible carrier member includes a dimensional thickness within the approximating range of 0.005 to 0.01 inches.

58. The method of forming a data processing card system as recited in claim 57 where said flexible carrier member includes a dimensional thickness approximating 0.0075 inches.

59. The method of forming a data processing card system as recited in claim 32 where said chip circuit device includes a dimensional thickness within the approximating range of 0.01 to 0.04 inches.

60. The method of forming a data processing card system as recited in claim 59 where said chip circuit device includes a dimensional thickness approximating 0.02 inches.

* * * * *